United States Patent [19]

Ceglio et al.

[11] Patent Number: 4,870,648
[45] Date of Patent: Sep. 26, 1989

[54] X-RAY BEAMSPLITTER

[75] Inventors: Natale M. Ceglio, Livermore; Daniel S. Stearns, Mountain View; Andrew M. Hawryluk, Modesto; Troy W. Barbee, Jr., Palo Alto, all of Calif.

[73] Assignee: The United States Department of Energy, Washington, D.C.

[21] Appl. No.: 82,468

[22] Filed: Aug. 7, 1987

[51] Int. Cl.$^4$ ................................................ H01S 3/08
[52] U.S. Cl. ......................................... 372/5; 372/99; 372/103; 378/145; 378/161
[58] Field of Search ................... 372/99, 195, 96, 103, 372/98, 108; 378/145, 161

[56] References Cited

U.S. PATENT DOCUMENTS

| | | | |
|---|---|---|---|
| 3,991,309 | 11/1976 | Hauer | 378/160 |
| 4,012,640 | 3/1977 | McKnight et al. | 372/5 |
| 4,205,329 | 5/1980 | Dingle et al. | 372/5 |
| 4,317,043 | 2/1982 | Rosenbluth et al. | 378/145 |
| 4,393,127 | 7/1983 | Greschner et al. | 378/161 |
| 4,704,718 | 11/1987 | Suckewer | 372/5 |

OTHER PUBLICATIONS

Attwood et al.; "Current Developments in High Resolution X-ray Measurements"; Lawrence Livermore Laboratory UCRL-87540 (1982).
Ceglio et al.; "Multilayer Structures for X-ray Laser Cavities"; SPIE, vol. 563; 1985; pp. 360-366.

Primary Examiner—William L. Sikes
Assistant Examiner—Xuan Thi Vo
Attorney, Agent, or Firm—Henry P. Sartorio; L. E. Carnahan; Judson R. Hightower

[57] ABSTRACT

An x-ray beamsplitter which splits an x-ray beam into two coherent parts by reflecting and transmitting some fraction of an incident beam has applications for x-ray interferometry, x-ray holography, x-ray beam manipulation, and x-ray laser cavity output couplers. The beamsplitter is formed of a wavelength selective multilayer thin film supported by a very thin x-ray transparent membrane. The beamsplitter resonantly transmits and reflects x-rays through thin film interference effects. A thin film is formed of 5-50 pairs of alternate Mo/Si layers with a period of 20-250 Å. The support membrane is 10-200 nm of silicon nitride or boron nitride. The multilayer/support membrane structure is formed across a window in a substrate by first forming the structure on a solid substrate and then forming a window in the substrate to leave a free-standing structure over the window.

25 Claims, 3 Drawing Sheets

X-RAY BEAMSPLITTER

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

The invention relates generally to X-ray optical elements and more particularly to multilayer thin film X-ray optical elements.

The demonstration of amplified spontaneous emission (ASE) at soft X-ray wavelengths has stimulated the need for normal incidence optics for soft X-rays. Amplification has been single pass amplified spontaneous emission and the amplifier, as well as its excitation and ionization, are produced by exploding a thin foil by interaction with a powerful optical laser. The exploding foil amplifier is coupled with various inversion schemes including neon-like and nickel-like collisional excitation as well as hydrogen-like three body recombination. In the case of Ne-like Se, the proper conditions for lasing are achieved by irradiating a 34 $\mu g/cm^2$ thick Se layer coated on one side of a 15 $\mu g/cm^2$ thickness plastic substrate with a pulse from the Nova laser operated at 0.53 microns, 500 ps FWHM pulselength, and $4 \times 10^{13}$ W/$cm^2$ intensity. The first high gain X-ray amplifier, at 20.6 and 20.9 nm, occurred in 1984. Since then using the neon-like schemes at least 15 laser transitions in Se, Y and Mo having wavelengths from 26.3 to 10.6 nm have been observed. Double pass amplification using a multilayer mirror operated at normal incidence has also been demonstrated. A multilayer X-ray mirror is placed at one end of a plasma X-ray amplifier to reinject one of the ASE amplifier's beams for further amplification.

From these results a natural direction for further X-ray laser advances is the development of an X-ray laser cavity. A cavity could provide significant enhancement of the X-ray laser emission and possible single transverse mode operation. Thus X-ray laser cavity components including normal incidence output couplers are required. An X-ray beam splitter which reflects and transmits some incident X-radiation is highly desirable; the reflected beam provides the necessary feedback into the laser cavity while the transmitted beam provides the output coupling. Thus the success of this next stage of X-ray laser research, the development of X-ray laser cavities, is highly dependent upon the availability of suitable cavity forming components including an output coupler such as an X-ray beam splitter. Unfortunately, although much research has been performed in the field of X-ray optics, an X-ray beamsplitter at soft X-ray and XUV wavelengths has not been heretofore available.

Multilayer coatings can be utilized as wavelength selective mirrors with reflectivities greater than 25%. As an example a multilayer mirror having about 20 layers of alternating Mo and Si with a layer periodicity of about 11 nm and mounted on a thick Si wafer can be used in the double pass cavity experiments. These X-ray mirrors are fabricated on a solid substrate material and produce X-ray reflection but no corresponding transmitted beam.

Conceptually these multilayer principles can be applied to X-ray beamsplitters as shown in "Current Developments in High Resolution X-ray Measurements", Attwood and Ceglio et al., Lawrence Livermore Laboratory UCRL-87540 (1982) and "Multilayer Structures for X-ray Laser Cavities", Ceglio et al., SPIE, Volume 563 Applications of Thin Film Multilayered Structures to Figured X-ray Optics (1985), pg 360. However, these conceptual beamsplitters were not successfully reduced to practice. Thus, a multilayer thin film X-ray beamsplitter has not been available.

U.S. Pat. No. 4,395,775 to Roberts shows a totally different type of beamsplitter design having a plurality of pores which transmit a portion of an incoming beam through the structure and a reflective surface surrounding the pores to reflect the remainder of the beam.

U.S. Pat. No. 4,317,043 to Rosenbluth shows an X-ray reflector having periodic monoatomic metal layers and hydrocarbon molecular layers. The X-ray reflector functions solely as a mirror and output coupling from the cavity is provided by a totally separate intracavity element such as a free standing foil which is placed at an angle to the cavity axis.

U.S. Pat. No. 3,991,309 to Hauer discloses a crystal which is stressed to enable and inhibit anomalous transmission therethrough.

Thus, although there is a need and interest in an X-ray beamsplitter, and multilayer theory could in principle be applied to design an X-ray beamsplitter, no one has successfully implemented a thin film multilayer X-ray beamsplitter. Such a beamsplitter could be used in a wide variety of applications, including interferometry and holography, as well as X-ray laser cavities.

SUMMARY OF THE INVENTION

Accordingly, it is an object of the invention to provide a thin film multilayer X-ray beam splitter and methods for making the same.

It is also an object of the invention to provide a thin film multilayer X-ray beamsplitter for use in a wide variety of applications, including multipass X-ray laser cavities and X-ray interferometers.

An X-ray beamsplitter having a multilayer thin film structure deposited on a very thin X-ray transparent support membrane and extending across an opening or window in a substrate reflects and transmits some large fraction of X-radiation at angles much larger than grazing incidence, including at or near normal incidence. The X-ray beamsplitter is fabricated by a combination of controlled deposition and X-ray lithography mask techniques. The invention includes the beamsplitter and the methods for making the beamsplitter. First a silicon wafer is topped with a thin layer of the support membrane material, e.g., 10–200 nm of silicon nitride, by chemical vapor deposition or other suitable process. An X-ray multilayer mirror, e.g., consisting of approximately 10 layer pairs of silicon and molybdenum, is then deposited onto the wafer over the support membrane layer, e.g by sputtering. The silicon wafer is then etched from the reverse side without damaging the deposited multilayers to form an opening or window beneath the multilayer structure and support membrane. Alternatively the process can be reversed, i.e. etch Si, then deposit multilayer. The resulting structure is a free standing X-ray beam splitter across the opening in the substrate, made of the multilayers and the support membrane, having a thickness of approximately 10–200 nm for the support membrane and about 30–200 nm for the multilayer mirror, and extending over an area up to or even exceeding 3×12 mm.

DETAILED DESCRIPTION OF THE PREFERRED EMBODIMENTS

The invention is a multilayered thin film X-ray beamsplitter for use at soft X-ray and XUV wavelengths and methods for making same. The invention represents the first successful production of such an X-ray beamsplitter. The invention succeeds in forming a free-standing multilayer thin film structure by depositing the multilayers on a very thin X-ray transparent support membrane. This is accomplished by first forming the multilayers and support membrane on a solid substrate and then forming a window in the substrate to leave the multilayer/support membrane structure free-standing over the window. Alternately, different ordering of the process can be used, e.g. etching before or after deposition. The beamsplitter splits an X-ray beam into two coherent parts.

Figure 1:
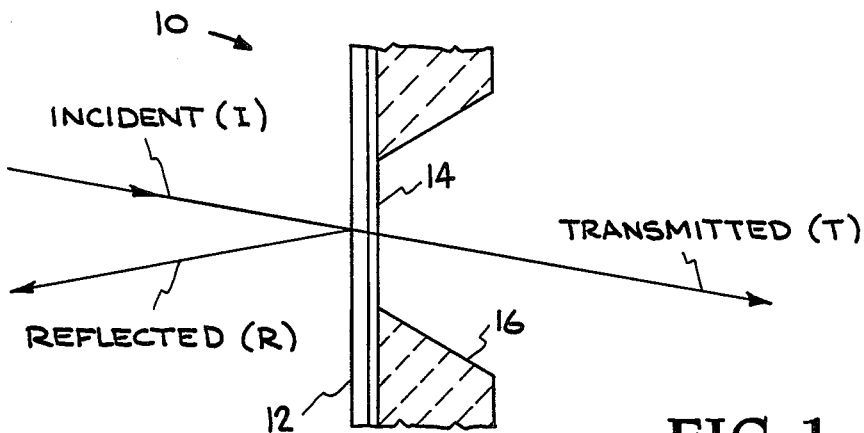
FIG. 1 is a schematic view of an X-ray beamsplitter.

As shown in FIG. 1 beamsplitter 10 is formed of multilayer 12 on support membrane 14 extending across an opening (window) in a substrate 16. The X-ray beamsplitter coherently divides an incident X-ray beam into two components, a reflected beam and a transmitted beam. The beamsplitter can operate at virtually any angle including substantially normal incidence.

X-ray beamsplitter 10 is in essence a multilayer film 12 supported by a very thin X-ray transparent membrane 14. Particular constituents and dimensions of the multilayer film depend on the wavelength and angle of the X-rays to be reflected. For example at a wavelength of 13 nm the films used are periodic alternate layers of molybdenum and silicon with a period of 71 A. Other materials can also be used for the multilayers, such as Au/C, W/C, Re/C, and W/Be; generally the requirements are a high atomic number (high Z)/ low atomic number (low Z) combination. The X-ray beamsplitter resonantly reflects and transmits X-rays through thin film interference effects. The resonance occurs when the condition $\lambda = 2 \mu d \sin \theta$ is satisfied where $\lambda$ is the resonant X-ray wavelength, d is the period of the multilayer structure, $\mu$ is a factor accounting for the refractive effects in the multilayer (typically about 1.0), and B is the angle of incidence measured relative to the surface of the mirror (90° for normal incidence).

The first soft X-ray beamsplitters have been successfully fabricated and characterized. These beamsplitters are formed of a multilayer mirror supported on a very thin (about 10–200 nm) silicon nitride $Si_3N_4$) membrane. The general fabrication technique for the beamsplitter requires making a thin X-ray transparent membrane and putting a multilayer on it; one particular process is summarized as follows. A polished 25 micron thick silicon wafer is coated with a thin (about 30 nm) $Si_3N_4$ layer by chemical vapor deposition. A Mo/Si multilayer mirror is subsequently deposited on top of the $Si_3N_4$ by magnetron sputtering techniques. The silicon support wafer is then chemically etched from the opposite side of the multilayer mirror to the silicon nitride layer, taking care to protect the multilayer from attack by the chemical etchant. A beamsplitter is thus formed of the $Si_3N_4$ supporting a Mo/Si multilayer structure over the etched window in the silicon substrate. Typical beamsplitter area, i.e., the area of the etched window in the substrate, is about 5 $mm^2$. Larger beamsplitters of 20 $mm^2$ or greater have been fabricated.

Figure 2:
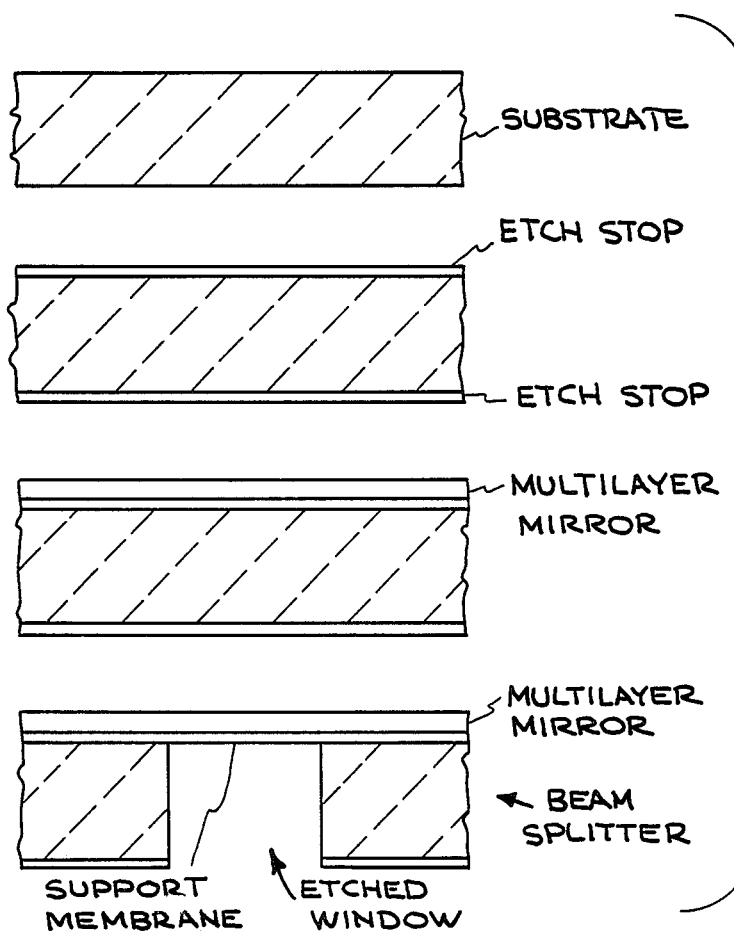
FIG. 2 illustrates a fabrication process for an X-ray beamsplitter.

A particular preferred embodiment of a fabrication process of the invention is illustrated in FIG. 2. This multistep process utilizes many recent advances in the field of microfabrication as well as deposition techniques. A silicon wafer is first prepared by a thorough cleaning process. An X-ray transparent etch stop is then deposited by low pressure chemical vapor deposition on both the front and back sides of the silicon wafer. Other substrates such as glass can also be used. The etch stop is a thin layer, typically 30 nm (300 A) to (500 A) but more generally 10–200 nm, of silicon nitride or boron nitride (BN). Other materials such as silicon may also be used. This etch stop will also form the support membrane for the beamsplitter so the layer must be X-ray transparent. Therefore the etch stop layer is very thin and composed of low Z materials. The support membrane may be substantially thinner than the multilayer film, but need not be so in all cases. A multilayer mirror is then deposited onto the front side of the silicon wafer on top of the etch stop layer by any suitable deposition technique. One method utilizes a dual head magnetron deposition system with a rotating wafer holder. The number of layers is chosen to give a reasonable reflection and transmission coefficient and depends on the X-ray wavelength and mirror materials and angle of incidence. Typically, about 10 layer pairs of molybdenum and silicon multilayers are used at X-ray wavelengths from 13 to 30 nm (130–300 A). These multilayer mirrors are then overcoated by about 1 nm of carbon to protect them from oxidation. In the final steps the backside of the silicon wafer is patterned using conventional lithographic techniques so that the thin etch stop layer on the backside is removed from a small area, up to $5 \times 15$ mm to expose the underlying silicon. The exposed silicon is then fully etched from the back all the way through to the thin etch stop layer on the front surface by using a highly selective anisotropic etch bath, e.g., 500 g of KOH in one liter of water at 70° C. This bath etches the (100) and (110) planes of the silicon crystal at approximately 500 nm/min. but etches less than 5 nm of silicon nitride in the 8 hours necessary to etch through the silicon wafer. Thus a window is formed through the silicon substrate to produce an X-ray beamsplitter comprising the multilayer mirror supported by the thin support membrane formed by the front etch stop layer. Since the etch bath would attack the multilayer, the multilayer must not come in contact with the etch bath during the fabrication process.

Figure 3:
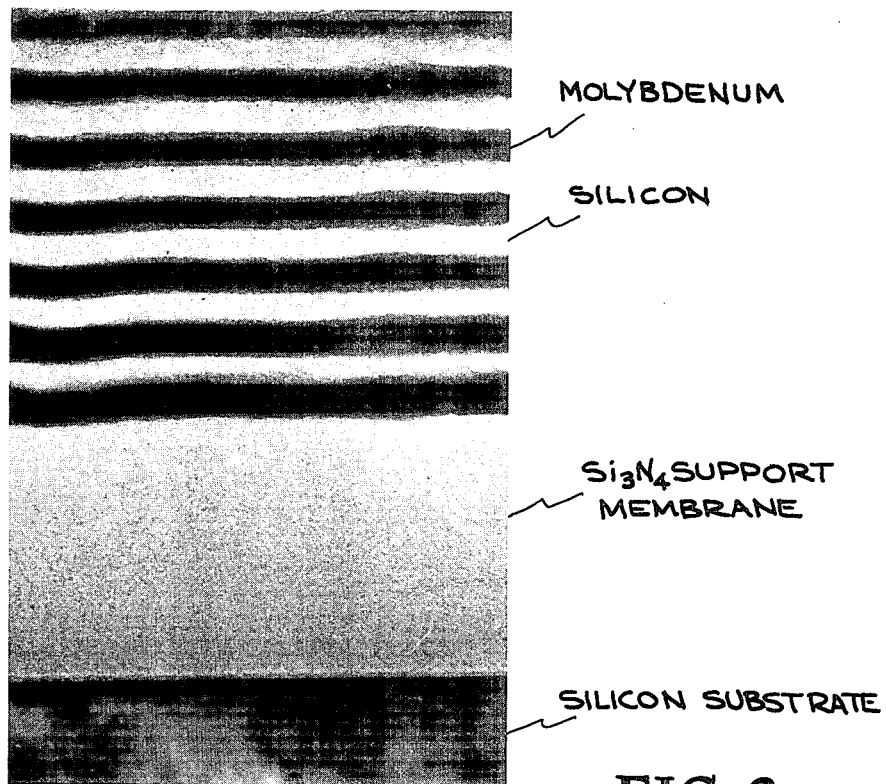
FIG. 3 is a TEM micrograph of a cross-section of an X-ray beamsplitter.

A beamsplitter designed for use at a wavelength of about 208 A is shown in FIG. 3. The beamsplitter is formed of alternating molybdenum layers, about 55 A thick, and silicon layers, about 52 A thick. The period of the alternating multilayers is about 108 A and 7 pairs of alternating layers are used. The multilayers are deposited on a $Si_3N_4$ support membrane about 440 A thick which is deposited on a silicon substrate. More generally, in the soft X-ray region, e.g. about 1 to 50 nm, 5 to 50 layer pairs with periods of 20 to 250 A are used.

Figure 4:
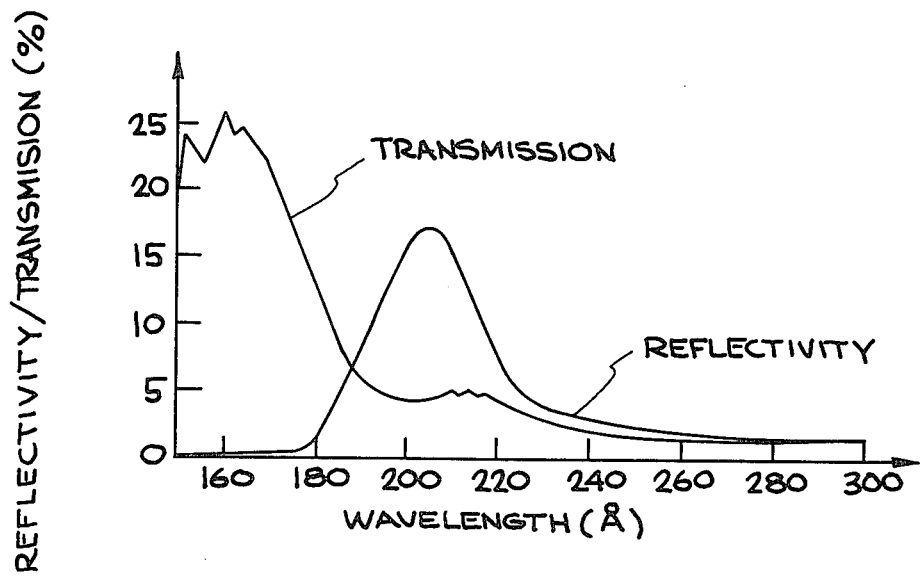
FIG. 4 is a graph of the performance characteristics of an X-ray beamsplitter at virtually normal incidence.

The performance characteristics for a normal incidence beamsplitter designed for use at 208 A (the beamsplitter of FIG. 3) is shown in FIG. 4. X-rays are incident at 0.5° from surface normal. The beamsplitter has a peak reflectivity of approximately 17 percent and a bandpass (FWHM) of approximately 28 A. The transmission at 208 A is 5 percent. More generally, the X-ray beamsplitter according to the invention provides for use at normal incidence requiring short period multilayers and its fabrication on a very thin but strong flat membrane allows significant X-ray transmission, greater than 50 percent, at soft X-ray wavelengths. Reflectivities as high as 25–30 percent can also be achieved, depending on the wavelength and angle.

The X-ray beamsplitter produced in accordance with the invention has a wide array of applications including X-ray interferometry, X-ray holography, X-ray beam manipulation of synchrotron radiation and X-ray laser cavity output couplers. The invention provides a new and valuable X-ray optical component. The devices can be manufactured at a low production cost.

Figure 5:
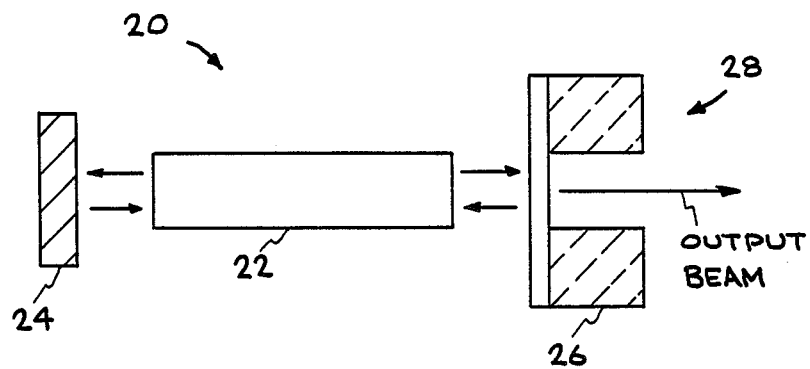
FIG. 5 illustrates an X-ray laser cavity formed with an X-ray beamsplitter output coupler.

As an output coupler for an X-ray laser cavity the beamsplitter could improve by 3 to 4 orders of magnitude the output power of low gain X-ray lasers while significantly improving transverse mode quality. As illustrated in FIG. 5, an X-ray laser cavity 20 is formed by surrounding a gain media 22 with a rear cavity reflector 24 and an output coupler 26. The rear cavity reflector 24 and output coupler 26 are spaced and aligned along the cavity axis. Gain media 22 is a plasma generating means which emits and amplifies X-rays of a desired wavelength along the cavity axis, and is typically a laser driven exploding foil amplifier of the type previously described. Rear cavity reflector 24 is formed of a multilayer X-ray mirror which can be made in either planar or curved surface geometries. The output coupler 26 is formed of a beamsplitter 28 as previously described.

Figure 6:
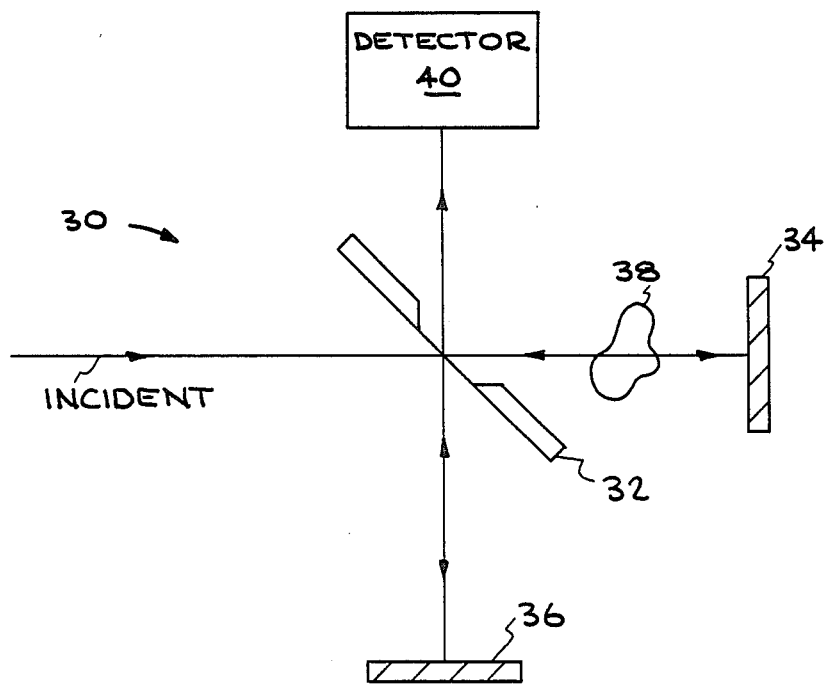
FIG. 6 illustrates an X-ray interferometer formed with an X-ray beamsplitter.

An X-ray beam can be coherently split into two beams which traverse different paths and are then recombined to form an X-ray interferogram or X-ray hologram. An X-ray interferometer 30, as illustrated in FIG. 6, utilizes a beamsplitter (B.S.) 32 as previously described to split an incident beam into two coherent beams. A portion of the incident beam is transmitted by beamsplitter 32 to a highly reflective normal incidence mirror 34, while a portion is reflected to reflective mirror 36. A sample 38 is placed in the path of one of the split beams, e.g. in front of mirror 34, so that one of the split beams passes through the sample. Mirrors 34, 36 reflect the beams back to beamsplitter 32 where a portion of one beam is transmitted to a detector 40 while a portion of the other beam is reflected to detector 40. The two beams, one of which has passed through the sample (twice) and the other which forms a reference, are combined in detector 40 to form an interferogram.

Changes and modifications in the specifically described embodiments can be carried out without departing from the scope of the invention which is intended to be limited only by the scope of the appended claims.

We claim:

1. An X-ray beamsplitter comprising:
   a substrate having a window therethrough;
   a very thin substantially flat X-ray transparent support membrane deposited on the substrate and extending across the window therein;
   a thin multilayer film deposited on the membrane and over the window in the substrate which resonantly reflects, and transmits X-rays of wavelength $\lambda$ incident at an angle of $\theta$ and has a periodicity d given by $\lambda = 2 \mu d \sin \theta$ where $\theta$ is the angle of incidence measured from the surface of the beamsplitter and $\mu$ is a predetermined factor which accounts for refractive effects in the multilayer film.

2. The beamsplitter of claim 1 wherein the thickness of the support membrane is substantially less than the thickness of the multilayer film.

3. The beamsplitter of claim 1 wherein the support membrane is formed of silicon nitride, boron nitride, or silicon.

4. The beamsplitter of claim 1 wherein the support membrane has a thickness of about 10 nm to 200 nm.

5. The beamsplitter of claim 1 wherein the substrate is a silicon wafer or glass.

6. The beamsplitter of claim 1 for X-ray wavelengths in the range of about 1 nm to about 50 nm wherein the multilayer film comprises about 5 to 50 layer pairs of molybdenum and silicon multilayers.

7. The beamsplitter of claim 6 wherein the periodicity of the multilayers is about 20 A to about 250 A.

8. The beamsplitter of claim 3 wherein the support membrane has a thickness of about 10 nm to 200 nm.

9. The beamsplitter of claim 1 wherein the window in the substrate has an area between about 5 to 35 mm².

10. A method for fabricating an X-ray beamsplitter comprising:
    preparing a substrate having front and back sides;
    depositing an etch stop layer formed of a thin layer of X-ray transparent material on the front and back sides of the substrate;
    depositing a thin multiplayer film of periodic alternating layers on the layer of X-ray transparent material on the front side of the substrate which resonantly reflects, and transmits X-rays of wavelength $\lambda$ incident at an angle $\theta$;
    patterning the layer of X-ray transparent material on the back side of the substrate and removing the layer from a small area to expose the substrate;
    etching the exposed substrate from the back side to the etch stop layer on the front side.

11. The method of claim 10 further comprising forming the etch stop layer of silicon nitride or boron nitride.

12. The method of claim 11 further comprising forming the etch stop layer of a thickness of about 10–200 nm.

13. The method of claim 10 further comprising forming a thin multilayer film which resonantly reflects, and transmits X-rays of wavelength $\lambda$ incident at an angle $\theta$ and has a periodicity d given by $\lambda = 2 \mu d \sin \theta$ where $\theta$ is the angle of incidence measured from the surface of the beamsplitter and $\mu$ is a predetermined factor which accounts for refractive effects in the multilayer film.

14. The method of claim 13 for X-ray wavelengths in the range of about 1 nm to 50 nm further comprising forming the multilayer film of about 5 to 50 layer pairs of molybdenum and silicon.

15. The method of claim 14 further comprising forming the layer pairs with a periodicity of about 20 A to 250 A.

16. A method for fabricating an X-ray beamsplitter comprising:

depositing a thin layer of X-ray transparent material on a front surface of a substrate;

depositing a thin multiplayer film of periodic alternating layers on the layer of X-ray transparent material which resonantly reflects, and transmits X-rays of wavelength λ incident at an angle θ;

etching the substrate from a back surface to the layer of X-ray transparent material on the front surface to form a window through the substrate over which the layer of X-ray transparent material and thin multilayer film extent.

17. The method of claim 16 further comprising forming the layer of X-ray transparent material from silicon nitride or boron nitride.

18. The method of claim 17 further comprising forming the layer of a thickness of about 10–200 nm.

19. The method of claim 16 further comprising forming a thin multilayer film which resonantly reflects, and transmits X-rays of wavelength λ incident at an angle θ and has a periodicity d given by $$\lambda = 2\ \mu d\ \sin\theta$$

where θ is the angle of incidence measured from the surface of the beamsplitter and μ is a predetermined factor which accounts for refractive effects in the multilayer film.

20. A method for fabricating an X-ray beamsplitter, comprising:

forming thin substantially flat X-ray transparent supporting membrane;

forming a thin multilayer film on the membrane which resonantly reflects, and transmits X-rays of wavelength λ incident at an angle θ and has a periodicity d given by $$\lambda = 2\ \mu d\ \sin\theta$$

where θ is the angle of incidence measured from the surface of the beamsplitter and μ is a predetermined factor which accounts for refractive effects in the multilayer film.

21. A resonant cavity for supporting X-ray laser action, comprising:

a multilayer thin film rear cavity X-ray mirror;

an X-ray beamsplitter spaced from and aligned with the rear cavity mirror along a cavity axis, the beamsplitter comprising:

a substrate having a window therethrough;

a very thin substantially flat X-ray transparent support membrane deposited on the substrate and extending across the window therein;

a thin multilayer film deposited on the membrane and over the window in the substrate which resonantly reflects and transmits X-rays of wavelength λ incident at an angel θ and has a periodicity d given by $$\lambda = 2\ \mu d\ \sin\theta$$

where θ is the angle of incidence measured from the surface of the beamsplitter and λ is a predetermined factor which accounts for refractive effects in the multilayer film; and a gain media positioned between the rear cavity X-ray mirror and the X-ray beamsplitter along said axis.

22. The resonant cavity of claim 21 wherein the gain media comprises means for generating a plasma in the cavity which emits and amplifies X-rays of said wavelength along said axis.

23. The resonant cavity of claim 22 wherein the plasma generating means is an exploding foil amplifier.

24. The resonant cavity of claim 21 wherein the support membrane is formed of silicon nitride or boron nitride having a thickness of about 300 A to 500 A.

25. The resonant cavity of claim 22 for X-ray wavelengths in the range of about 1 nm to about 50 nm wherein the multilayer film comprises about 5 to 50 layer pairs of molybdenum and silicon multilayers having a periodicity of the multilayers of about 20 A to about 250 A.

* * * * *